(12) United States Patent
Wiersma et al.

(10) Patent No.: US 12,446,358 B2
(45) Date of Patent: Oct. 14, 2025

(54) SELECTIVE RELEASE AND TRANSFER OF MICRO DEVICES

(71) Applicant: VueReal Inc., Waterloo (CA)

(72) Inventors: Aaron Daniel Trent Wiersma, Kitchener (CA); Pranav Prasad Gavirneni, Kitchener (CA)

(73) Assignee: VueReal Inc., Waterloo (CA)

( * ) Notice: Subject to any disclaimer, the term of this patent is extended or adjusted under 35 U.S.C. 154(b) by 655 days.

(21) Appl. No.: 17/614,193

(22) PCT Filed: May 25, 2020

(86) PCT No.: PCT/IB2020/054921
§ 371 (c)(1),
(2) Date: Nov. 24, 2021

(87) PCT Pub. No.: WO2020/240395
PCT Pub. Date: Dec. 3, 2020

(65) Prior Publication Data
US 2022/0254950 A1    Aug. 11, 2022

Related U.S. Application Data

(60) Provisional application No. 62/852,555, filed on May 24, 2019.

(51) Int. Cl.
*H10H 20/01*    (2025.01)
*H01L 21/683*   (2006.01)
(Continued)

(52) U.S. Cl.
CPC ....... *H10H 20/018* (2025.01); *H01L 25/0753* (2013.01); *H10H 20/814* (2025.01);
(Continued)

(58) Field of Classification Search
CPC ............. H01L 33/44; H01L 2933/0025; H01L 2224/245; H01L 2224/2919;
(Continued)

(56) References Cited

U.S. PATENT DOCUMENTS 9,768,345 B2 * 9/2017 Hu ........................ H01L 33/20
11,094,530 B2 * 8/2021 Zhang ................... H01L 21/707
(Continued)

FOREIGN PATENT DOCUMENTS

CA    2986503 A1 * 5/2019 ......... H01L 21/6835
CN    108431971 A    8/2018
(Continued)

OTHER PUBLICATIONS

PCT International Search Report and Written Opinion relating to PCT application No. PCT/IB2020/054921 dated Aug. 1, 2020.
(Continued)

*Primary Examiner* — Sonya McCall-Shepard

(57) ABSTRACT

A method of selectively transferring micro devices from a donor substrate to contact pads on a receiver substrate. The method may comprise: providing a donor substrate comprising the plurality of micro devices, transferring the plurality of micro devices to an intermediate substrate, aligning a selected set of micro devices on the intermediate substrate proximal to the system substrate, providing a photo-sensitive layer between the selected set of micro devices and the system receiver; turning on the selected micro devices, curing the photo-sensitive layer in between the selected set of micro devices and the system substrate by light emitted by the selected micro devices; and bonding the selected set of micro devices to the corresponding contact pads on the system substrate.

19 Claims, 7 Drawing Sheets

(51) Int. Cl.
    *H01L 23/00*     (2006.01)
    *H01L 25/075*     (2006.01)
    *H10H 20/814*     (2025.01)
    *H10H 20/819*     (2025.01)
    *H10H 20/84*     (2025.01)
    *H10H 20/857*     (2025.01)

(52) U.S. Cl.
    CPC .......... *H10H 20/819* (2025.01); *H10H 20/84* (2025.01); *H10H 20/857* (2025.01); *H10H 20/034* (2025.01); *H10H 20/0364* (2025.01)

(58) Field of Classification Search
    CPC ....... H01L 33/0093; H01L 2224/83005; H01L 21/6835; H01L 2224/83871; H01L 2221/68322; H01L 2221/68363; H01L 2221/68381; H01L 2224/04105; H01L 2224/24226; H01L 2224/73267; H01L 2224/821; H01L 2224/92244; H01L 2924/10157; H01L 24/19; H01L 24/20; H01L 24/24; H01L 24/82; H01L 24/83; H01L 2924/12041; H01L 25/0753; H10H 20/84; H10H 20/034; H10H 20/0364; H10H 20/036; H10H 20/018
    See application file for complete search history.

(56) References Cited

U.S. PATENT DOCUMENTS

| | | | |
|---|---|---|---|
| 2002/0195609 A1 | 12/2002 | Yoshitake et al. | |
| 2003/0054588 A1 | 3/2003 | Patel et al. | |
| 2009/0199960 A1 | 8/2009 | Nuzzo et al. | |
| 2012/0314388 A1 | 12/2012 | Bower et al. | |
| 2014/0367705 A1 | 12/2014 | Bibl et al. | |
| 2015/0179876 A1 | 6/2015 | Hu et al. | |
| 2016/0276326 A1 | 9/2016 | Natarajan et al. | |
| 2017/0215280 A1 | 7/2017 | Chaji et al. | |
| 2018/0033768 A1* | 2/2018 | Kumar ............... | H01L 27/15 |
| 2018/0069149 A1 | 3/2018 | Zou et al. | |
| 2018/0095124 A1 | 4/2018 | Chaji et al. | |
| 2018/0145277 A1 | 5/2018 | Yamazaki et al. | |

FOREIGN PATENT DOCUMENTS

| | | | |
|---|---|---|---|
| CN | 109148506 A | | 1/2019 |
| KR | 20190116178 A | * | 10/2019 |
| TW | 564584 B | | 12/2003 |
| WO | 2011072376 A1 | | 6/2011 |

OTHER PUBLICATIONS

TW Office Action relating to TW Application No. 109117259, dated Sep. 27, 2023.

SIPO: PCR (China) Office Action relating to CN Application No. 202080034593.7, dated Apr. 4, 2025.

TW Office Action relating to TW Application No. 113130905, dated Apr. 28, 2025.

* cited by examiner

SELECTIVE RELEASE AND TRANSFER OF MICRO DEVICES

CROSS-REFERENCE TO RELATED APPLICATION

This application claims benefit of and priority to U.S. Patent Application No. 62/852,555, filed May 24, 2019, which is hereby incorporated by reference herein in its entirety.

BACKGROUND AND FIELD OF THE INVENTION

The present disclosure relates to integrating micro devices into a system substrate, and more specifically, the present disclosure relates to structure and methods to transfer and bond selective micro devices from a donor substrate to a receiver substrate, Many micro devices including light emitting diodes (LEDs), organic LEDs, sensors, solid state devices, integrated circuits, MEM'S (microelectromechanical systems), and other electronic components are typically fabricated in batches, often on planar substrates. To form an operational system, micro devices from at least one donor substrate need to be selectively transferred to a receiver substrate.

Various methods have been employed to transfer micro devices from a donor substrate to a receiver substrate. In one method, the receiver three is generated selectively to improve selectivity during the micro device transfer. The receiver force may be generated by using a mechanical, thermal, or electrostatic technique, however these techniques present problems. These techniques generally require complex mechanical structures for transfer. In another method, which is very difficult to complete physically, localized heating can be selectively turned on to increase the temperature locally.

In another transfer method, localized epoxy photo curing can be used to photo cure a micro device from the donor substrate onto the receiver substrate. However, limitations and difficulties arise when controlling the spot size for the external light source and stigmation. This causes undesired adjacent micro devices within close proximity to cure and transfer. In these alternative methods, technology is limited when the device size is miniaturized and the micro device density on a substrate is increased.

Therefore, there is a need for an improved method and system to efficiently release micro devices, specifically microLED's from the donor substrate, and transfer them to the receiver substrate.

SUMMARY

One objective of this invention is to provide methods and structures to transfer and bond selective micro devices from a donor substrate to a receiver substrate, Another objective of this invention is to provide a transfer process, wherein a cartridge substrate has bonding materials that releases the micro devices device to the receiver substrate in a presence of a light while the same light cures the bonding of devices to the receiver substrate.

According to one embodiment, a method to integrate a plurality of micro devices on a system substrate may be provided. The method may comprise: providing a donor substrate comprising the plurality of micro devices, transferring the plurality of micro devices to an intermediate substrate, aligning a selected set of micro devices on the intermediate substrate proximal to the system substrate, providing a photo-sensitive layer between the selected set of micro devices and the system receiver; curing the photo-sensitive layer in between the selected set of micro devices and the system substrate by light emitted by the selected micro devices; and bonding the selected set of micro devices to the corresponding contact pads on the system substrate.

In one case, the photo-sensitive layer may comprise a visible light curable transparent epoxy or a photoresist layer. In another case, the photo-sensitive layer may comprise an adhesive.

According to another embodiment, transferring the selected set of micro devices to the corresponding contact pads on the system substrate may comprise: coating at least a portion of the system substrate with the photo-sensitive layer, aligning and pressing the intermediate substrate to the system substrate so that each of the selected micro devices is in line with corresponding contact pads on the system substrate, turning on the selected set of micro devices; and curing the photo-sensitive layer.

According to yet another embodiment, the micro devices are fabricated on the donor substrate.

According to one embodiment, sidewall reflectors may be provided on or over the micro devices on the donor substrate to reflect the light back toward the micro device.

According to yet further embodiments, a sacrificial release layer may be conformally coated on or over the micro devices on the donor substrate. The sacrificial layer may be a photoresist layer.

According to one aspect of the invention, light may be reflected off of the sidewall reflectors.

According to another embodiment, a transparent planarization layer for the final device structure on the backplane substrate may be provided.

According to one aspect of the invention, there is provided a controlled communication capability with the micro devices on the donor substrate According to another aspect of the invention, self-emissive curing by locally focusing micro device light may be provided.

According to one aspect of the invention, a method of selectively transferring at least one microLED may be provided.

According to another aspect of the invention, the present method generally requires simple mechanical structures for transfer.

According to yet another aspect of the invention, the present method generally requires light to cure the photo-sensitive layer as compared to heat and pressure in other conventional methods.

The foregoing and additional aspects and embodiments of the present disclosure, it will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the disclosure will become apparent upon reading the following detailed description and upon reference to the drawings.

Use of the same reference numbers in different figures indicate similar or identical elements.

Figure 1:
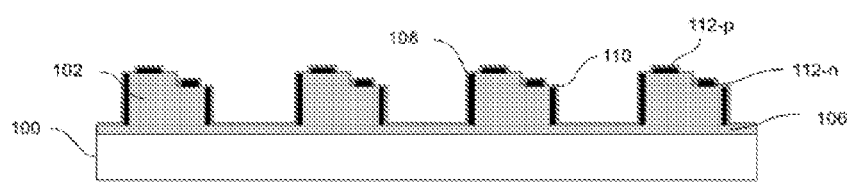
FIG. 1 illustrates a cross-sectional view of a donor substrate with micro devices, in accordance, with all embodiment of the present invention.

The foregoing and additional aspects and embodiments of the present disclosure will be apparent to those of ordinary skill in the art in view of the detailed description of various embodiments and/or aspects, which are made with reference to the drawings, a brief description of which is provided next.

DETAILED DESCRIPTION

While the present disclosure is susceptible to various modifications and alternative forms, specific embodiments or implementations are shown by way of example in the drawings and will be described in detail herein. It should be understood, however, that the disclosure is not intended to be limited to the particular forms disclosed. Rather, the disclosure covers all modifications, equivalents, and alternatives falling within the spirit of the invention as defined by the appended claims.

In this description, the terms "system substrate", "receiver substrate" and "display substrate" are used interchangeably. However, it is clear to one skilled in the art that the embodiments described herein are independent of substrate type.

In this description, the terms "donor substrate" and "carrier substrate" are used interchangeably. However, it is clear to one skilled in the art that the embodiments described herein are independent of substrate type.

In this description, the terms "temporary substrate", "intermediate substrate", and "cartridge substrate" are used interchangeably, However, it is clear to one skilled in the art that the embodiments described herein are independent of substrate type.

In this description, the terms "wafer" and "substrate" are used interchangeably. However, it is clear to one skilled in the art that the embodiments described herein are independent of substrate type.

In addition, these embodiments exemplarily illustrate four micro light-emitting devices, but the invention is not limited thereto. The number of micro light-emitting devices may be changed according to actual requirements.

FIG. 1 illustrates a cross-sectional view of a donor substrate with micro devices, in accordance with an embodiment of the present invention.

Here, micro devices (e.g., GaN LEDs) are fabricated by depositing a stack of material on a sapphire substrate. The micro devices structure may be in the form of one of: a cylindrical structure, a mesa structure, a Hip-chip structure, or a vertical structure.

A GaN LED device 102 which includes a donor substrate 100, such as sapphire, an n-type GaN layer formed on the substrate 100 or a buffer layer 106 (for example, undoped GaN), an active layer such as multiple quantum well (MQW) layer and a p-type GaN layer. A transparent conductive layer such as Ni/Au or ITO is usually formed on the p-doped GaN layer for a better lateral current conduction. The donor substrate may be a growth substrate or a carrier substrate. Conventionally, the p-type metal contact 112-*p* such as Pd/Au, Pt or Ni/Au is then formed on the transparent conductive layer. Because the substrate (Sapphire) is an insulator, then-type GaN is exposed to make contact to this layer. This step is usually done using a dry-etch process to expose the n-type GaN and then deposit the appropriate metal contacts. E.g., n-type metal contact 112-*n*.

In some embodiments, sidewall reflectors 108 may be deposited over the micro device on the donor substrate to reflect the light back towards the sidewalls of the micro device. In one case, the reflectors may be made out of metal (e.g., Ag, Al, Au). In another case, the reflectors may be made out of the distributed Bragg reflectors.

In either case, these sidewall reflectors should be optimized to have a high reflectivity of the emission spectrum for the specific microLED. For example, red LEDs may have a different reflector than blue LEDs based on which is more efficient at reflection at that wavelength (color).

In one embodiment, the micro devices may be conformally coated with a sacrificial release layer 110, The sacrificial release layer 110 may be comprised of a photoresist layer, metal layer, or conformal dielectric layer. However, the sacrificial layer composition is not limited to these materials listed above. In one case, the sacrificial release layer 110 must be etched selectively with regards to the sidewall reflector 108.

In another embodiment, a passivation layer may be provided around the micro devices on the donor substrate. In one case, the passivation layer may be a dielectric layer to isolate the micro LED sidewalls. In another case, the passivation layer may be polyimide, The dielectric layer and sidewall reflectors 108 may then be patterned by using for example, lithographic patterning and etching to partially expose the top surface of micro LEDs.

Figure 2:
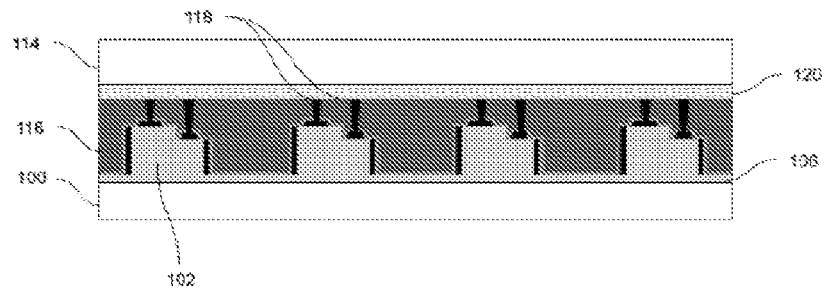
FIG. 2 illustrates a cross-sectional view of circuit integration to a temporary substrate with integrated micro devices, in accordance with an embodiment of the present invention.

FIG. 2 illustrates a cross-sectional view of integration of a temporary substrate with donor substrate with integrated micro devices in accordance with all embodiment of the present invention. With reference to FIG. 2, an embodiment of the present invention, comprises a substrate 100, microdevices 102, and a driving circuit layer 120. A buffer layer 106 may be deposited between the substrate 100 and the micro devices 102. The buffer layer (or layers) may be used as a delamination layer as well as for separating the fully integrated system from the substrate 100. A planarization layer 116 is developed over and around the micro-devices 102. It is possible that the planarizing layer 116 is comprised of a few different layers and materials. Openings/vias 118 are then formed, e.g. etched, into the planarizing layer 116 down to the photoresist layer. In one case, vias are created through depositing a conductive material such as a metal or a transparent conductive oxide into the trenches. In one example, vias are created by sputtering metal into the trenches. The photoresist may be removed from the local areas.

The temporary substrate 114 may then be bonded to micro devices by disposing a driving circuit layer 120 in the openings, whereby the driving circuit layer may be patterned for individual micro devices. The driving circuit layer 120 may be either thin film transistors (TFT), CMOS chiplet, or other type of integrated circuit. In one case, the temporary substrate 114 may be a glass substrate or a sapphire substrate.

Figure 3:
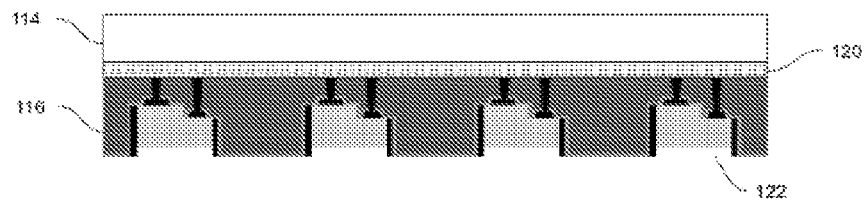
FIG. 3 illustrates a cross-sectional view of removing the donor substrate, in accordance with an embodiment of the present invention.

FIG. 3 illustrates a cross-sectional view of removal of donor substrate in accordance with an embodiment of the present invention. In one embodiment, after mounting the temporary substrate 114, the donor substrate 100 may be removed. The donor substrate 100 may be removed from the lateral functional devices. In one case, the donor substrate may be removed using laser lift off. The donor substrate may be irradiated with laser to lift off the micro devices from the donor substrate and transferred to the temporary substrate. In another case, the donor substrate may be removed using chemical lift off especially in case of red micro devices. As red LEDs are made of GaAs on a GaAs donor substrate, chemical lift off may be a better choice for removal of the donor substrate. However, chemical lift off may be used on any other type of micro devices such as blue and green made of GaN on a sapphire substrate.

According to one embodiment, the micro devices on the donor substrate may be provided with different anchors, whereby after liftoff of the devices, the anchor holds the device to the donor substrate. The anchor may also be directly connected to the donor substrate or indirectly through other layers.

In the next step, the GaN buffer layer 122 and passivation layer on the sides of the micro devices may be etched back. GaN and passivation layer can be etched to ~1~2 um using ICP etching for light focusing.

Figure 4:
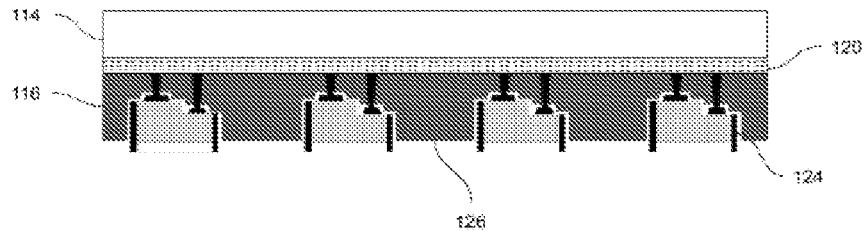
FIG. 4 illustrates a cross-sectional view of selectively removing the sacrificial layer, in accordance with an embodiment of the present invention.

FIG. 4 illustrates a cross-sectional view of selective removal of sacrificial layer in accordance with an embodiment of the present invention. In one embodiment, the sacrificial layer 110 which is coated over the micro-LEDs may be removed. In one example, the micro devices can be covered by a sacrificial layer that can be de-bonded from the temporary substrate by chemical, optical, thermal, or mechanical forces. The debonding process can be selective or global. The sacrificial layer may be removed through solution processing. e.g., solvent stripping or acid etching. The sacrificial layer is removed to ease the release process of micro devices.

In one case, the planarization layer 126 may be etched back or plasma etching may be done.

The process of transfer of micro devices from cartridge to receiver substrate can be based on different mechanisms.

Figure 5:
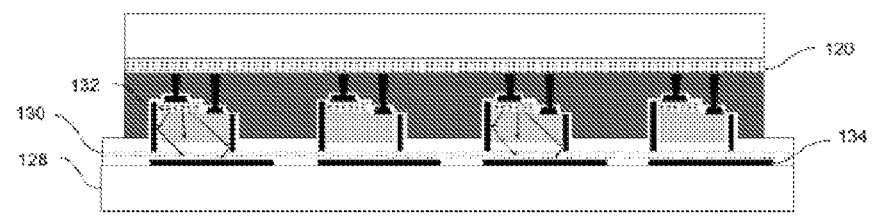
FIG. 5 illustrates a cross-sectional view of integrating micro devices to the backplane using visible light curable photoresist/epoxy, in accordance with an embodiment of the present invention.

FIG. 5 illustrates a cross-sectional view of integrating micro devices to the backplane using visible light curable photoresist/epoxy in accordance with an embodiment of the present invention. After removing the sacrificial layer, the next steps may be bonding the micro devices to the receiver substrate. With reference to FIG. 5, the receiver substrate may be provided with contact pads for coupling or connecting the micro devices. The micro devices may be coupled or connected to a driving circuitry 134 on the receiver substrate through contact pads. The driving circuitry may either thin film transistors (TFT), CMOS chiplet, or other type of integrated circuit formed on the receiver substrate. Here, the receiver substrate 128 may be fabricated separately. The temporary substrate and the receiver substrate may be aligned so that the selected micro devices are in line with corresponding contact pads. The temporary substrate and the receiver substrate may be moved together until the selected micro devices are positioned with a defined distance of the contact pads. The defined distance may correspond to full or partial contact but is not limited thereto. In other words, it may not be strictly necessary that selected micro devices actually touch corresponding contact pads, but must be near enough so that the forces described below can be manipulated.

In one embodiment, a thin layer/film of the photo-sensitive layer/visible light 130 e.g., a red light curable photoresist or epoxy may be applied/coated selectively or globally over the receiver substrate 128. The layer/film should not be cured until the microLED emits light into the film, which then cures it. This will cause the microLED to be bonded to the backplane. The adhesion force of the bond is stronger than the force holding the microLED to the cartridge. when the cartridge is lifted, anchor will break and the microLED will be transferred to the backplane, In one aspect, the temporary substrate to the backplane/system substrate may be aligned and pressed so that each of the selected micro devices is in line with a contact pad on the system substrate. The selected micro devices may actually touch corresponding contact pads on the receiver pads. The micro devices 132 may be turned on. A selective set of micro devices or all the micro devices may be turned on, Light may be reflected off to the sidewall reflectors. Since the reflectors actually dig into the visible light curable photoresist/epoxy, light leakage and curing of close proximity devices is minimized. The visible light curable epoxy may be cured. In one case, the epoxy is curing with light. In another case, it may be cured with heat or pressure. A selected set of microdevices may be transferred to the corresponding contact pads on the system substrate.

This method can be applied multiple times to the same receiver substrate, using different or the same intermediate substrates.

Figure 6:
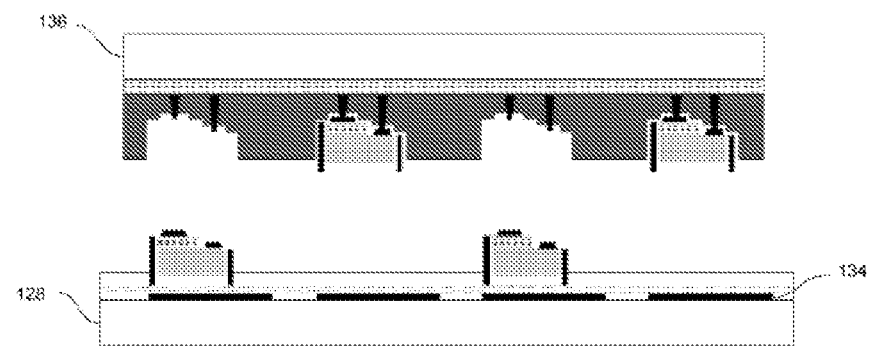
FIG. 6 illustrates a cross-sectional view. of using the temporary substrate to transfer other sets of micro devices, in accordance with an embodiment of the present invention.

In one case, after all devices are transferred, the un-cured photo-sensitive layer (locations where there are no devices) may be removed through developer solution, FIG. 6 illustrates a cross-sectional view of using the temporary substrate for transferring other set of micro devices, in accordance with an embodiment of the present invention. The temporary substrate and the receiver substrate are moved apart leaving selected micro devices attached to corresponding contact pads as shown in FIG. 6.

Once temporary substrate is separated from the receiver substrate, further processing steps can be taken. For example, the temporary substrate 136 and the receiver substrate 128 can be realigned and steps can be repeated in order to transfer a different set of micro devices to a different set of contact pads until the temporary substrate is empty.

If the receiver substrate is fully populated, the receiver substrate may be moved to the next steps. If further population is needed for the receiver substrate, further transfer steps from one or more additional cartridges substrate may be conducted. Before a new transfer cycle, if the cartridge does not have enough devices, the cycle starts from the first step. If the cartridge substrate has enough micro devices, the cartridge substrate is offset (or moved and aligned) to a new area of the receiver substrate in subsequent steps, In one example, a second light curable layer may be provided between a second set of selected micro devices, different from the selected micro devices, and a second set of the contact pads, different from the selected contact pads, on the receiver substrate, Then, the intermediate substrate 136 and the receiver substrate 128 may be realigned so that each of the second set of selected micro devices is in line with a second set of the contact pads on the receiver substrate. The donor substrate and the receiver substrate may be moved together until each of the second set of selected micro devices is in contact or proximity with the second set of the contact pads on the receiver substrate and the second light curable layer.

Figure 7:
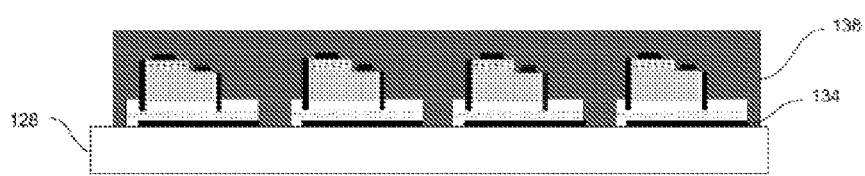
FIG. 7 illustrates a cross-sectional view of a transparent planarization layer on the backplane substrate, in accordance with an embodiment of the present invention.

FIG. 7 illustrates a cross-sectional view transparent planarization layer on the backplane substrate in accordance with an embodiment of the present invention. Once intermediate substrate is separated from the receiver substrate, further processing steps can be taken. In one aspect, a transparent planarization layer 138 for the final device structure on the backplane substrate may be provided. This planarization layer may be etched down to the metal contacts on the micro-LED. Vias can be created in the planarization layer to control the LEDs.

Figure 8A:
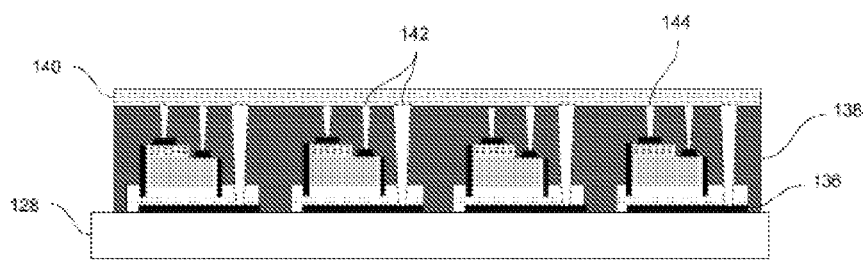
FIG. 8A illustrates a cross-sectional view of a top side emission using metal reflectors. in accordance with an embodiment of the present invention.

FIG. 8A. illustrates a cross-sectional view of a top side mission using metal reflectors in accordance with an embodiment of the present invention. Here, the common top contact may be a patterned electrode system 140, The micro devices may be connected to the backplane through the openings/vias 142 in the planarization layer. The common top electrode 140 may be composed of a transparent conductive oxide such as ITO which is deposited through physical vapor deposition. However, the common top electrode is not limited to these materials. The metal reflectors may be composed of a reflective conductor such as Au, Ag, Cr, etc. and are deposited through physical vapor deposition. However, the metal reflectors are not limited to these materials. The backplane may control and communicate with at least one microLED at any given time.

Figure 8B:
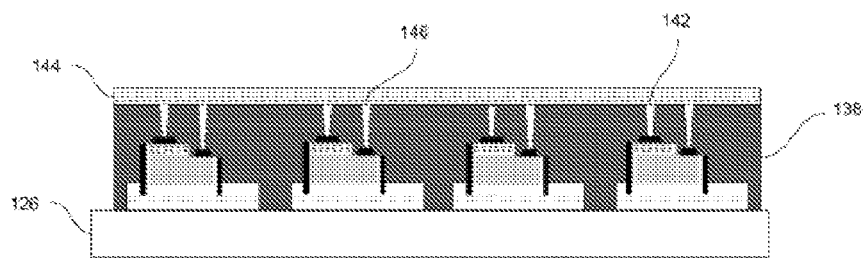
FIG. 8B illustrates a cross-sectional view of a backside emission using metal reflectors, in accordance with an embodiment of the present invention.

FIG. 8B illustrates a cross-sectional view of a backside emission using metal reflectors in accordance with an embodiment of the present invention. Here, the driving circuit layer 144 may be patterned for individual micro devices. It can be passive or optimized for release.

Figure 8C:
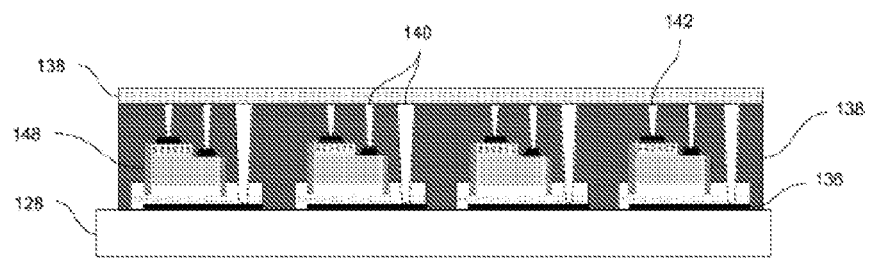
FIG. 8C illustrates a cross-sectional view of a top side emission through distributed Bragg reflectors, in accordance with an embodiment of the present invention.

FIG. 8C illustrates a cross-sectional view top side emission through distributed Bragg reflectors in accordance with an embodiment of the present invention. with reference to FIG. 8C, instead of using metal reflectors at the sidewalls of the micro devices, distributed Bragg reflectors 148 may be used. These are highly reflective structures made of alternating dielectric layers with different refractive indices. An example of a Bragg reflector is composed of alternating layers of Si and Mo or TiO2 and SiN. However, the Bragg reflector composition is not limited to these materials. The material may be deposited using physical vapor deposition.

Figure 8D:
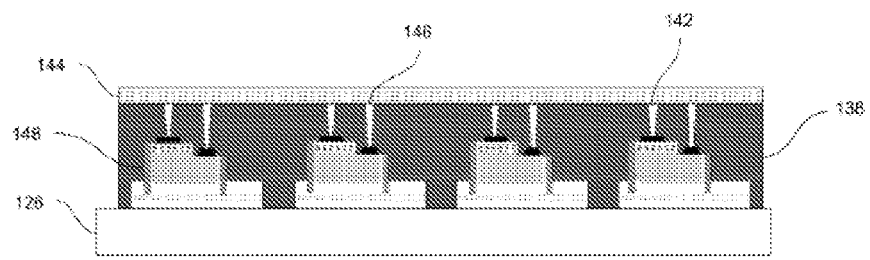
FIG. 8D illustrates a cross-sectional view of a backside emission through distributed Bragg reflectors, in accordance with an embodiment of the present invention.

FIG. 8D illustrates a cross-sectional view of backside emission through distributed Bragg reflectors in accordance with an embodiment of the present invention. Here, the driving circuit layer 144 may be patterned for individual micro devices. It can be passive or optimized for release.

Figure 9:
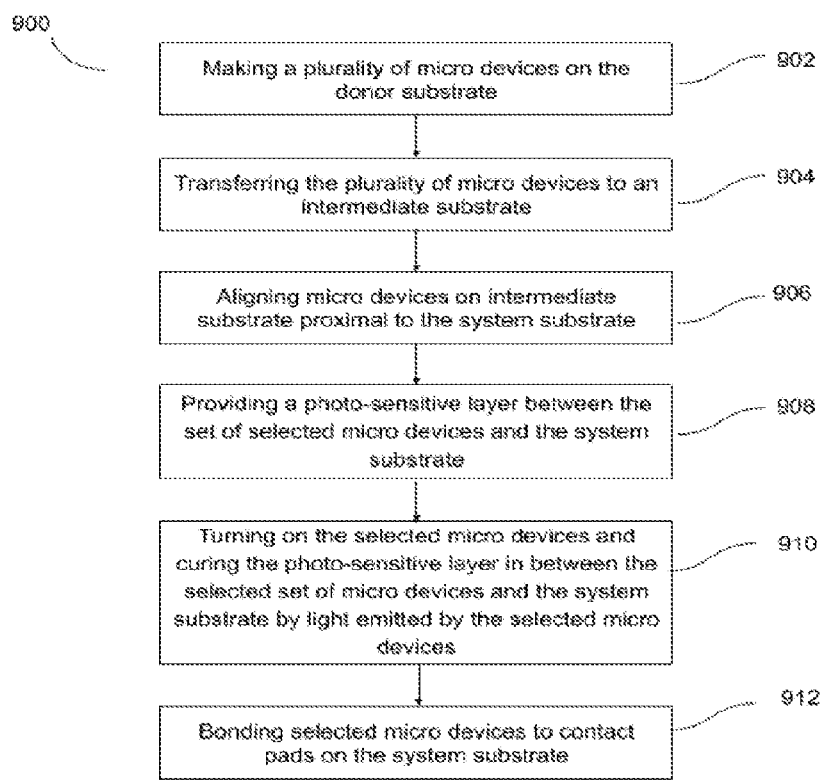
FIG. 9 shows a series of steps to transfer and bond micro devices to the backplane, in accordance with an embodiment of the present invention.

FIG. 9 shows a flowchart of a method 900 to transfer and bond micro devices to the backplane in accordance with an embodiment of the present invention. In step 902, a plurality of micro devices are provided on the donor substrate. In step 904, the plurality of micro devices are transferred to an intermediate substrate. The micro devices are then aligned in step 906 to proximal to the system substrate. A photosensitive layer between the set of selected micro devices and the system substrate is provided in step 908, Then, in step 910, a selected set of micro devices may be turned on and the photo-sensitive layer in between the selected set of micro devices and the system substrate may be cured by light emitted by the selected micro devices. In step 912, the selected micro devices are bonded to the corresponding contact pads on the system substrate.

According to one embodiment, a method to integrate a plurality of micro devices on a system substrate may be provided. The method may comprise: providing a donor substrate comprising the plurality of micro devices, transferring the plurality of micro devices to an intermediate substrate, aligning a set of selected micro devices on the intermediate substrate proximal to the system substrate, providing a photo-sensitive layer between the set of selected micro devices and the system receiver: and transferring the selected set of micro devices to the corresponding contact pads on the system substrate.

According to another embodiment, the photo-sensitive layer may comprise a visible light curable transparent epoxy or a photoresist layer or an adhesive.

According to yet another embodiment, transferring the selected set of micro devices to the corresponding contact pads on the system substrate may comprise coating at least a portion of the system substrate with the photo-sensitive layer, aligning and pressing the intermediate substrate to the system substrate so that each of the selected micro devices is in line with corresponding contact pads on the system substrate, turning on the selected set of micro devices; and curing the photo-sensitive layer. The photo-sensitive layer is cured by applying light.

According to further embodiments, the method may further comprise removing the intermediate substrate.

According to some embodiments, the step of providing the donor substrate comprises the micro devices comprising: fabricating the micro devices on the donor substrate, mounting reflectors on sidewalls of the micro devices on the donor substrate, depositing a sacrificial layer conformally on or over the micro devices; and providing a planarization layer on and over the micro devices.

According to another embodiment, the planarization layer may be patterned to form openings on top of the micro devices for connecting to the intermediate substrate.

According to yet another embodiment, the sacrificial layer may comprise one of a: photoresist layer, metal layer, or conformal dielectric layer. The sacrificial layer may be removed before aligning the micro devices on the intermediate substrate proximal to the system substrate. The sidewall reflectors may be patterned using etching or photolithography to expose a top surface of the micro devices.

According to one embodiment, the micro devices may be fabricated on the donor substrate comprising one of: a cylindrical structure, a mesa structure, a flip-chip structure, or a vertical structure.

According to another embodiment, the step of transferring the plurality of micro devices to the intermediate substrate may comprising: providing an anchor for holding each micro device to the donor substrate; and removing the donor substrate. The donor substrate is removed by one of a: laser lift off or chemical etching.

According to some embodiments, removing the intermediate substrate may comprise breaking the anchor of the selected set of micro devices. The intermediate substrate may comprise a patterned driving circuit layer. The patterned driving layer may comprise TFT. The system substrate is one of a: sapphire substrate or glass substrate.

According to yet another embodiment, the method may further comprising a second aligning of a second set of selected micro devices on the intermediate substrate proximal to the system substrate, providing a second photo-sensitive layer between the second set of selected micro devices and the system substrate, moving the intermediate substrate to the system substrate so that each of the second set of selected micro devices is in line with corresponding second selected contact pads on the system substrate, turning on the second set of selected micro devices, curing the photo-sensitive layer in between the second set of selected micro devices and the system substrate; and bonding the second set of selected micro devices to the corresponding second contact pads on the system substrate.

According to another embodiment, the photo-sensitive layer may be applied globally or selectively.

According to one embodiment, the method may further comprise providing a transparent planarization layer over the system substrate after removing the intermediate substrate and removing the un-cured photo-sensitive layer through a developer solution.

In summary, there are provided methods and structures to transfer and bond micro devices from a donor substrate to a receiver substrate.

The foregoing description of one or more embodiments of the invention has been presented for illustration and description purposes. It is not intended to be exhaustive or to limit the invention to the precise form disclosed. Many modifications and variations are possible in light of the teaching herein. The scope of the invention is not intended to be limited by this detailed description, but rather by the appended claims.

The invention claimed is:

1. A method of integrating a plurality of micro devices on a system substrate comprising:
providing a donor substrate comprising the plurality of micro devices;
transferring the plurality of micro devices to an intermediate substrate;
aligning a set of selected micro devices of the plurality of micro devices on the intermediate substrate proximal to the system substrate;
moving the intermediate substrate to the system substrate so that each of the selected micro devices is in line with corresponding contact pads on the system substrate;
providing a photo-sensitive layer between the set of selected micro devices and the system substrate;
turning on the set of selected micro devices;
curing the photo-sensitive layer in between the set of selected micro devices and the system substrate by light emitted by the selected micro devices; and
bonding the set of selected micro devices to the corresponding contact pads on the system substrate,
wherein the step of providing the donor substrate comprising the plurality of micro devices comprises:
fabricating the plurality of micro devices on the donor substrate;
mounting reflectors on sidewalls of the plurality of micro devices on the donor substrate;
depositing a sacrificial layer conformally on or over the plurality of micro devices;
providing a planarization layer on and over the plurality of micro devices; and
forming one of a plurality of openings and vias into the planarizing layer down to the sacrificial layer for forming openings on top of the plurality of micro devices for connecting to the intermediate substrate.

2. The method of claim 1, wherein the photo-sensitive layer comprises a visible light curable transparent epoxy or photoresist.

3. The method of claim 1, wherein the photo-sensitive layer is applied globally or selectively.

4. The method of claim 1, further comprising:
removing the un-cured photo-sensitive layer through a developer solution.

5. The method of claim 1, further comprising: removing the intermediate substrate.

6. The method of claim 1, wherein the sacrificial layer comprises one of a: photoresist layer, metal layer, or conformal dielectric layer.

7. The method of claim 1, wherein the sacrificial layer is removed before aligning the plurality of micro devices on the intermediate substrate proximal to the system substrate.

8. The method of claim 1, wherein the sidewall reflectors are patterned using etching or photolithography to expose a top surface of the plurality of micro devices.

9. The method of claim 1, wherein the plurality of micro devices fabricated on the donor substrate comprises one of: a cylindrical structure, a mesa structure, a flip-chip structure, or a vertical structure.

10. The method of claim 1, wherein the step of transferring the plurality of micro devices to the intermediate substrate comprising:
providing an anchor for holding each micro device of the plurality of micro devices to the donor substrate; and
removing the donor substrate.

11. The method of claim 10, wherein the donor substrate is removed by one of a: laser lift off or chemical etching.

12. The method of claim 10, wherein removing the intermediate substrate comprises breaking the anchor of the selected set of micro devices.

13. The method of claim 1, wherein the intermediate substrate comprises a patterned driving circuit layer.

14. The method of claim 13, wherein the patterned driving layer comprises thin film transistor.

15. The method of claim 1, wherein the system substrate is one of a: sapphire substrate or glass substrate.

16. The method of claim 1, further comprising
a second aligning of a second set of selected micro devices on the intermediate substrate proximal to the system substrate;
providing a second photo-sensitive layer between the second set of selected micro devices and the system substrate;
moving the intermediate substrate to the system substrate so that each of the second set of selected micro devices is in line with corresponding second selected contact pads on the system substrate;
turning on the second set of selected micro devices:
curing the photo-sensitive layer in between the second set of selected micro devices and the system substrate; and
bonding the second set of selected micro devices to the corresponding second contact pads on the system substrate.

17. The method of claim 1, wherein the photo-sensitive layer is applied globally or selectively.

18. The method of claim 4, further comprising:
providing a transparent planarization layer over the system substrate after removing the intermediate substrate.

19. The method of claim 3, further comprising:
removing the uncured photo-sensitive layer through a developer solution.

* * * * *